(12) United States Patent
Jamieson et al.

(10) Patent No.: US 8,386,892 B1
(45) Date of Patent: Feb. 26, 2013

(54) PARTIAL PACKET RECOVERY FOR WIRELESS NETWORKS

(75) Inventors: Kyle Jamieson, Cambridge, MA (US); Hari Balakrishnan, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1507 days.

(21) Appl. No.: 11/934,991

(22) Filed: Nov. 5, 2007

(51) Int. Cl.
 *H03M 13/00* (2006.01)
 *H03M 13/45* (2006.01)

(52) U.S. Cl. ........................................ 714/780
(58) Field of Classification Search .................. 714/748, 714/751, 780
 See application file for complete search history.

(56) References Cited

U.S. PATENT DOCUMENTS

| | | | | |
|---|---|---|---|---|
| 4,888,767 A * | 12/1989 | Furuya et al. | ................ | 370/243 |
| 5,444,718 A * | 8/1995 | Ejzak et al. | ................ | 714/748 |
| 5,841,819 A * | 11/1998 | Hu et al. | ................ | 375/341 |
| 6,700,867 B2 * | 3/2004 | Classon et al. | ................ | 370/216 |
| 7,003,709 B2 * | 2/2006 | Wengerter et al. | ............ | 714/748 |
| 7,024,611 B2 * | 4/2006 | Chen et al. | ................ | 714/751 |
| 7,065,696 B1 * | 6/2006 | Liu et al. | ................ | 714/755 |
| 7,110,351 B2 * | 9/2006 | Steer et al. | ................ | 370/208 |
| 7,197,692 B2 * | 3/2007 | Sutivong et al. | ............ | 714/796 |
| 7,234,095 B2 * | 6/2007 | Lee et al. | ................ | 714/751 |
| 7,269,774 B2 * | 9/2007 | Sudo | ................ | 714/748 |
| 7,293,216 B2 * | 11/2007 | Dorney et al. | ............ | 714/752 |
| 7,536,626 B2 * | 5/2009 | Sutivong et al. | ............ | 714/760 |
| 7,586,930 B2 * | 9/2009 | Koski | ................ | 370/442 |
| 7,606,342 B1 * | 10/2009 | Wiss et al. | ................ | 375/371 |
| 7,734,994 B2 * | 6/2010 | Shoarinejad et al. | ........ | 714/807 |
| 7,797,618 B2 * | 9/2010 | Wang et al. | ................ | 714/795 |
| 7,979,784 B2 * | 7/2011 | Shao et al. | ................ | 714/807 |
| 8,065,579 B2 * | 11/2011 | Hoshino et al. | ............ | 714/748 |
| 8,074,138 B2 * | 12/2011 | Chae et al. | ................ | 714/748 |

* cited by examiner

*Primary Examiner* — James C Kerveros
(74) *Attorney, Agent, or Firm* — Anderson Gorecki & Rouille LLP

(57) ABSTRACT

A method, apparatus and computer program product for providing partial packet recovery (PPR) for wireless networks is presented. PPR incorporates an expanded physical layer (PHY) interface that provides PHY-independent hints to higher layers about the PHY's confidence in each bit it decodes, and a technique to recover data even when a packet preamble is corrupted and not decodable at the receiver. Also described is an asynchronous link-layer automatic repeat request (ARQ) protocol built on PPR that allows a receiver to compactly encode a request for retransmission of only those bits in a packet that are likely in error.

15 Claims, 11 Drawing Sheets

PARTIAL PACKET RECOVERY FOR WIRELESS NETWORKS

GOVERNMENT RIGHTS

This invention was made with support under Award Numbers CNS-0520032 and CNS-0205445, awarded by the National Science Foundation. The Government has certain rights in this invention.

BACKGROUND

Bit errors can occur in wireless communication when interference or noise overcomes the coded and modulated transmission. Current wireless protocols may use forward error correction (FEC) to correct some small number of bit errors, but generally retransmit the whole packet if the FEC is insufficient.

SUMMARY

Conventional mechanisms such as those explained above suffer from a variety of deficiencies. One such deficiency is that when bit errors occur in wireless communications, current wireless network protocols retransmit a number of packets. Most of these retransmissions end up sending bits that have already been received multiple times, thereby wasting network capacity.

Bit errors over wireless channels occur when the signal to interference and noise ratio (SINR) is not high enough to decode information correctly. In addition to noise, poor SINR arises from the interference caused by one or more concurrent transmissions in the network, and varies in time even within a single packet transmission. Thus a tension arises between permitting concurrent transmissions to increase spatial reuse, and receiving those transmissions correctly. Even with a variety of physical layer (PHY) techniques such as spread-spectrum and Orthogonal Frequency Division Multiplexing (OFDM) modulation, channel coding, and the like, current systems rely heavily on link-layer retransmissions to recover from bit errors and achieve high capacity. Since wireless channels are hard to model and predict, designing an error-free communication link generally entails sacrificing significant capacity; instead, a design that occasionally causes errors to occur fares better in this regard. Retransmissions allow a receiver to recover from lost packets.

Retransmitting entire packets works well over wired networks where bit-level corruption is rare and a packet loss implies that all the bits of the packet were lost (e.g., due to a queue overflow in a switch). Over radio, however, all the bits in a packet don't share the same fate: very often, only a small number of bits in a packet are in error (referred to as partial packet loss); the rest are correct. Thus, it is wasteful to re-send the entire packet.

There are several challenges in reducing the need to re-send an entire packet in order to recover form partial packet loss. A receiver needs to determine which bits are correct and which are not. Additionally, since most PHYs require the receiver to synchronize with the sender on a preamble before decoding a packet's contents, any corruption to the preamble (caused, for instance, by a packet collision from another transmission) greatly diminish the potential benefits of a partial packet recovery mechanism and technique. Further still is determining how higher layer protocols can use partial packets to improve end-to-end performance.

Embodiments of the presently disclosed method and apparatus significantly overcome such deficiencies and provide mechanisms and techniques that provide partial packet recovery (PPR) for wireless networks.

PPR incorporates an expanded physical layer (PHY) interface that provides PHY-independent hints to higher layers about the PHY's confidence in each bit it decodes, and a technique to recover data even when a packet preamble is corrupted and not decodable at the receiver. Also described is an asynchronous link-layer automatic repeat request (ARQ) protocol built on PPR that allows a receiver to compactly encode a request for retransmission of only those bits in a packet that are likely in error.

In a particular embodiment of a method for providing partial packet recovery, the method includes receiving an incoming wireless signal and demodulating the input wireless signal to obtain at least one output symbol. The method further includes producing a hint for each of the (at least one) output symbol(s), the hint indicating which bits of the received symbols are likely to be correct, and passing the hint to a next layer interface. The hint is utilized to determine which parts of the incoming wireless signal to request retransmission of.

In another embodiment, a method of postamble packet decoding includes receiving a packet having a postamble, the postamble including an end-of-frame delimiter and a training sequence. The method also includes maintaining a circular buffer of samples of previously-received symbols. Additionally, the method includes failing to detect a preamble for the packet. The method further includes rolling back as many symbols as are indicated in a packet trailer of the packet and decoding and parsing the trailer to determine the start of the entire packet and the sender and receiver identities, then rolling back as many symbols as are in the entire packet. The method also includes decoding as much of the packet as possible.

Still another embodiment includes receiving a list of symbols and receiving a list of hints, wherein each hint is correlated to a respective symbol. This method further includes labeling, based on the hint, each symbol as good or bad and then computing alternating run lengths of good and bad symbols. Additionally the method includes determining groups of runs to request retransmission of from the alternating run lengths of good and bad symbols and sending a feed back packet requesting retransmission of at least one run of the group of runs.

Other embodiments include a computer readable medium having computer readable code thereon for providing partial packet recovery in wireless networks. The computer readable medium includes instructions for receiving an incoming wireless signal and instructions for demodulating the input wireless signal to obtain at least one output symbol. The computer readable medium further includes instructions for producing a hint for each of the at least one output symbol, the hint indicating which bits of the symbol are likely to be correct, and instructions for passing the hint to a next layer interface. The computer readable medium further includes instructions for utilizing the hint to determine which parts of the incoming wireless signal to request retransmission of.

In another embodiment, a computer readable medium having computer readable code thereon for postamble packet decoding is presented. The computer readable medium includes instructions for receiving a packet having a postamble, the postamble including an end-of-frame delimiter and a training sequence. The computer readable medium also includes instructions for maintaining a circular buffer of samples of previously received symbols. Additionally the computer readable medium includes instructions for failing to detect a preamble for the packet. Further still the computer readable medium includes instructions for rolling back as many symbols as are indicated in a packet trailer of the packet and instructions for decoding and parsing the trailer to determine a start of the entire packet and the sender and receiver identities and rolling back as many symbols as are in the entire packet. Further, the computer readable medium includes instructions for decoding as much of the packet as possible.

Still another embodiment includes a computer readable medium having computer readable code thereon including instructions for receiving a list of symbols and instructions for receiving a list of hints, wherein each hint is correlated to a respective symbol. The computer readable medium further includes instructions for labeling, based on the hint, each symbol as good or bad and instructions for computing alternating run lengths of good and bad symbols. Additionally the computer readable medium includes instructions for determining groups of runs to request retransmission of from the alternating run lengths of good and bad symbols and instructions for sending a feedback packet requesting retransmission of at least one run of the group of runs.

Still other embodiments include a computerized device, configured to process all the method operations disclosed herein as embodiments of the invention. In such embodiments, the computerized device includes a memory system, a processor, communications interface in an interconnection mechanism connecting these components. The memory system is encoded with a process that provides partial packet recovery for wireless networks as explained herein that when performed (e.g. when executing) on the processor, operates as explained herein within the computerized device to perform all of the method embodiments and operations explained herein as embodiments of the invention. Thus any computerized device that performs or is programmed to perform up processing explained herein is an embodiment of the invention.

Other arrangements of embodiments of the invention that are disclosed herein include software programs to perform the method embodiment steps and operations summarized above and disclosed in detail below. More particularly, a computer program product is one embodiment that has a computer-readable medium including computer program logic encoded thereon that when performed in a computerized device provides associated operations providing partial packet recovery for wireless networks as explained herein. The computer program logic, when executed on at least one processor with a computing system, causes the processor to perform the operations (e.g., the methods) indicated herein as embodiments of the invention. Such arrangements of the invention are typically provided as software, code and/or other data structures arranged or encoded on a computer readable medium such as an optical medium (e.g., CD-ROM), floppy or hard disk or other a medium such as firmware or microcode in one or more ROM or RAM or PROM chips or as an Application Specific Integrated Circuit (ASIC) or as downloadable software images in one or more modules, shared libraries, etc. The software or firmware or other such configurations can be installed onto a computerized device to cause one or more processors in the computerized device to perform the techniques explained herein as embodiments of the invention. Software processes that operate in a collection of computerized devices, such as in a group of data communications devices or other entities can also provide the system of the invention. The system of the invention can be distributed between many software processes on several data communications devices, or all processes could run on a small set of dedicated computers, or on one computer alone.

It is to be understood that the embodiments of the invention can be embodied strictly as a software program, as software and hardware, or as hardware and/or circuitry alone, such as within a data communications device. The features of the invention, as explained herein, may be employed in data communications devices and/or software systems for such devices.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
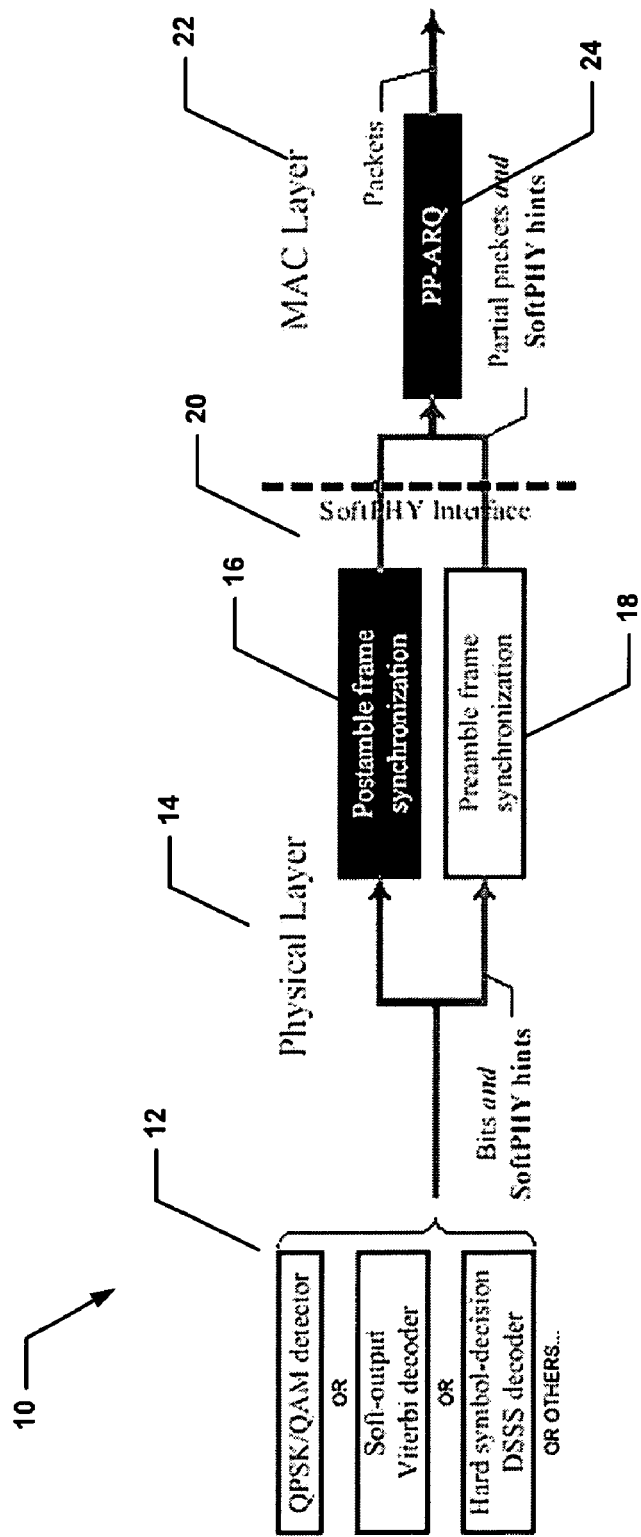
FIG. 1 depicts a high-level block diagram of a PPR system in accordance with embodiments of the invention.

Partial Packet Recovery (PPR) is an invention that improves aggregate network capacity by greatly reducing the number of redundant bits transmitted. Information from the physical layer is used to improve error resilience. PPR incorporates the following to overcome the deficiencies with conventional wireless networks described above.

A SoftPHY interface allows the receiver to determine, with no additional feedback or information from the sender, which bits are likely to be correct in any given packet reception using hints from the PHY. The PHY passes up information about how close each received symbol or codeword was to the symbol or codeword the PHY decided upon. The higher layer can then use this information as a hint, independent of the underlying details in the PHY.

PPR can further incorporate postamble decoding which allows a receiver to receive and decode bits correctly even from packets whose preambles are corrupted by other transmissions or noise. The information in the preamble and packet header is duplicated in a postamble and a packet trailer, allowing a receiver to lock on the postamble and then "roll back" in time to recover data that was previously unable to be decoded.

Using PPR, a link-layer retransmission protocol (PP-ARQ) is provided in which the receiver compactly requests the retransmission of only the select portions of a packet where there are bits likely to be wrong. The sender retransmits the bits and checksums for those ranges, so that the receiver can eventually be certain that all the bits in the packet are correct. The receiver's request encoding uses a dynamic programming algorithm that minimizes the expected bit overhead of communicating this feedback, balancing that against the cost of the sender retransmitting bits already received correctly.

The SoftPHY and postamble decoding steps running at the receiver can recover partial packets from unmodified Zigbee senders, while PP-ARQ requires sender-side modifications. For additional insight PPR has been implemented in an uncoded DQPSK receiver.

The underlying premise in PPR is that significant performance gains can be obtained by the combination of a more aggressive, higher-rate PHY and being more flexible about the granularity of error recovery in wireless networks. PPR can improve performance in both access point-based networks and wireless mesh networks.

In conventional receivers, the PHY outputs only a sequence of bits after demodulation and channel decoding. This interface is rather limiting, since higher layers have no easy way of ascertaining the certainty that the PHY has in each bit it outputs. The PHY, however, has this information, and each group of bits output can be annotated with the confidence the PHY has in those bits' correctness. SoftPHY can be utilized with an uncoded demodulator, a DSSS receiver with hard-decision symbol decoding, and soft-decision decoders.

One benefit of the current layered receiver architecture is that the PHY provides a digital abstraction, which isolates layers above the PHY from implementation details of the PHY itself. While a variety of PHY implementations can provide the SoftPHY interface, the semantics of SoftPHY hints are tied to the details of the PHY, potentially violating this digital abstraction.

In PPR, layers above the PHY are not aware of how SoftPHY hints are calculated. Instead, they adapt their decisions on how to handle each bit based on observation. For example, the MAC layer could observe the correlation between a particular threshold and the correctness of the hint, and adapt the threshold dynamically. This approach can be used as long as the PHY simply provides a monotonicity contract; i.e., given any two SoftPHY hint values, $h_1$ and $h_2$, $h_1 < h_2$ implies that the PHY has a higher confidence in the bits associated with $h_1$ than with $h_2$ (or vice-versa).

FIG. 1 is a block diagram of a PPR system 10. A receiver 12 passes bits and SoftPHY hints to the physical layer 14, which includes postamble frame synchronization block 16 along with preamble frame synchronization block 18. These are used to pass partial packets and SoftPHY hints by way of the SoftPHY interface 20 to the MAC layer 22. Postamble decoding increases the number of opportunities for recovering partial packets from the receiver. SoftPHY hints propagate to PP-ARQ 24, the partial packet retransmission layer.

Thus, while SoftPHY hints themselves are PHY-dependent, layers above the PHY use SoftPHY hints in a PHY-independent manner, retaining the benefits of the PHY's digital abstraction. At the same time, from an information-theoretic perspective, the SoftPHY design necessitates no loss of information: the bits and the hints can contain the same amount of information as the raw signal samples.

Figure 2:
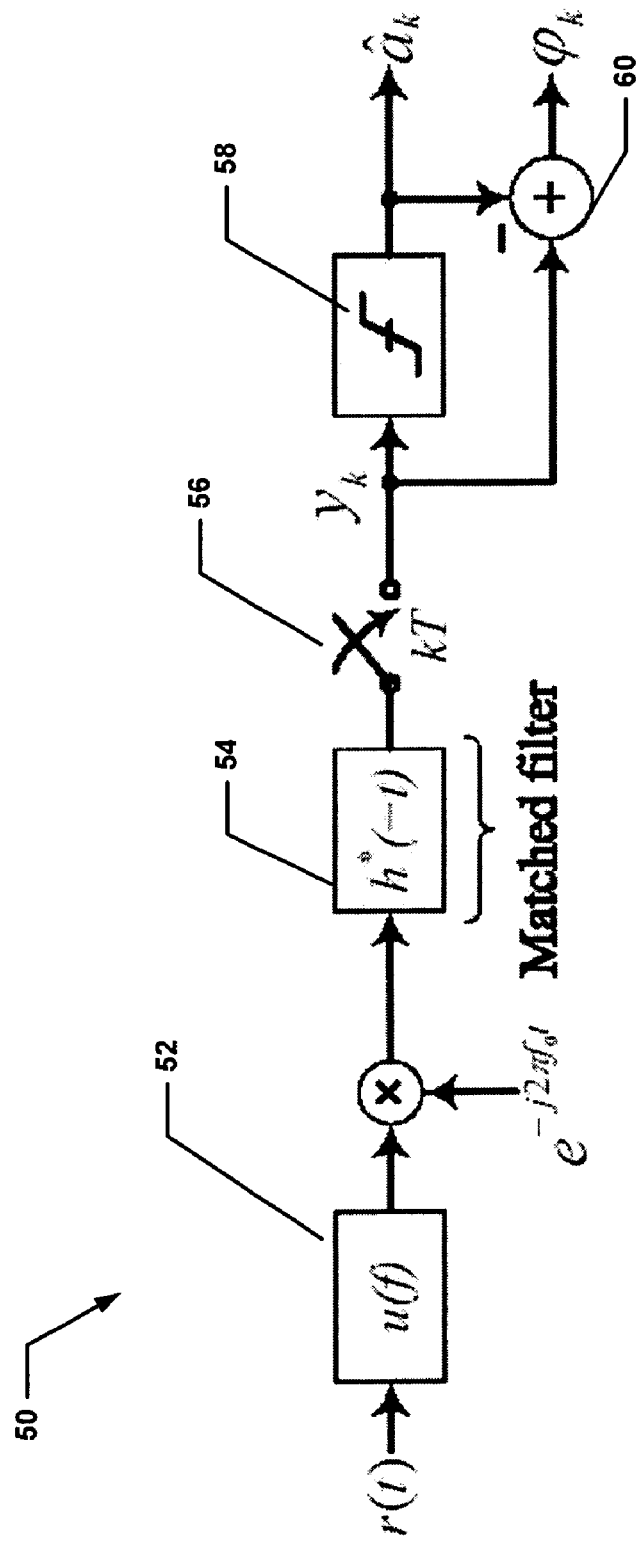
FIG. 2 is a block diagram of a particular embodiment of a demodulator producing symbols and hints in accordance with embodiments of the invention.

Referring now to FIG. 2, a digital receiver 50 that has been augmented to return SoftPHY hints is shown. Once the incoming signal r(t) has been downconverted to baseband by downconverter 52, the structure that maximizes SNR at the output of the receiver is a filter 54 matched to the shape of the transmitted signal as seen through the channel, h(t). After being sampled by sampler 56, the sampled signal is passed to a slicer 58, which quantizes the sampled signal to one of a few symbols $â_k$. For each quantized output symbol, PHY hints $\phi_k$ are determined at subtractor 60 as the difference between the sampler output $â_k$ and the slicer output $\phi_k$. This SoftPHY hint can be interpreted as the distance in signal space between r(t)'s constellation point and the decoded symbol's constellation point.

A Zigbee implementation uses a hard decision decoder (HDD). To understand how SoftPHY works in a Zigbee receiver, a conceptual model of the wireless communication system will be helpful. This model also applies to common direct-sequence spread spectrum (DSSS) or OFDM-DSSS radio. In particular, it applies to 802.15.4 (Zigbee) and 802.11b/g (WiFi), two common standards.

Figure 3:
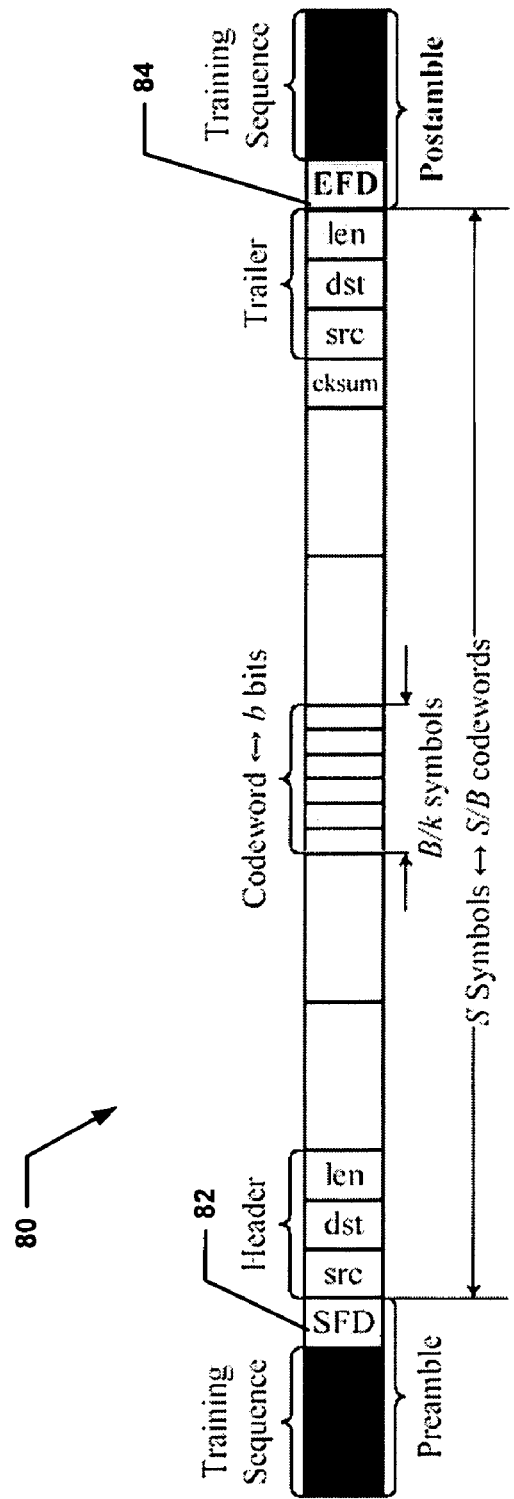
FIG. 3 is a block diagram of a frame.

In block coding, the PHY maps groups of b source bits to a B-bit (B-chip) codeword as shown in FIG. 3. As shown in FIG. 3, a frame 80 is composed of S symbols, preceded by a start-of-frame delimiter (SFD) 82 and followed by an end-of-frame delimiter (EFD) 84. Symbols are organized into S/B codewords of B/k symbols each by channel coding or direct-sequence spread spectrum. Each codeword encodes b data bits.

Since there are only $2^b$ unique b-bit strings, the space of valid codewords is extremely sparse. The sender then groups the codewords into channel symbols encoding $k \geq 1$ bits each, and sends the channel symbols over the air, modulated over some baseband transmit waveform. In Zigbee, k=2, b=4, and B=32, thus each group of four source bits in the original packet gets spread over 32 chips, or B/k=16 channel symbols.

In an HDD design, the demodulator outputs hard symbol decisions ($â_k$ in FIG. 2) for each symbol in turn, independent of other symbols. It then sends that information to the channel decoder, which maps the received codeword to the closest valid codeword. The proximity of this mapping, measured as the Hamming distance between the received word and the codeword (the number of distinct elements between the two words), can serve as a useful confidence hint.

For better performance at low SINR, a decoder can use soft-decision decoding (SDD). The SDD decoder works directly on samples of received symbols $y_k$, before they are sliced, thus using more information to make its decisions.

In a block-based code, the SDD decoder calculates the correlation C between the received samples Y and each codeword $C_i$ (whose jth bit is $c_{ij}$) defined as:

$$C(Y, C_i) = \sum_{j=1}^{n} y_j c_{ij}. \quad (1)$$

C can then serve as a SoftPHY hint from the PHY to higher layers.

In the case of a convolutional code, SoftPHY can use the soft output of the Viterbi or BCJR decoder. This output is a measure of how well the received symbol sequence matches with the path through the coding trellis associated with the chosen codeword.

In some ways, SoftPHY might seem analogous to soft-decision decoding, but there is an architectural difference. With soft-decision decoding, the demodulator's interface to the decoder is quite different from hard decoding. In the former, the demodulator does not attempt to make a decoding decision, instead propagating received signal samples up to the decoder. In contrast, in the SoftPHY design, the PHY doesn't simply pass up all its raw information to the higher layer. The PHY still makes "hard" decisions, thus preserving layering boundaries. This architecture preserves a clean decomposition between PHY and higher layers while enabling performance gains.

Preliminary experiments were conducted with the HDD and SDD schemes described above. It was found that bit errors were mostly attributable to collisions, and in this case, the difference between HDD and SDD was not significant.

Figure 4:
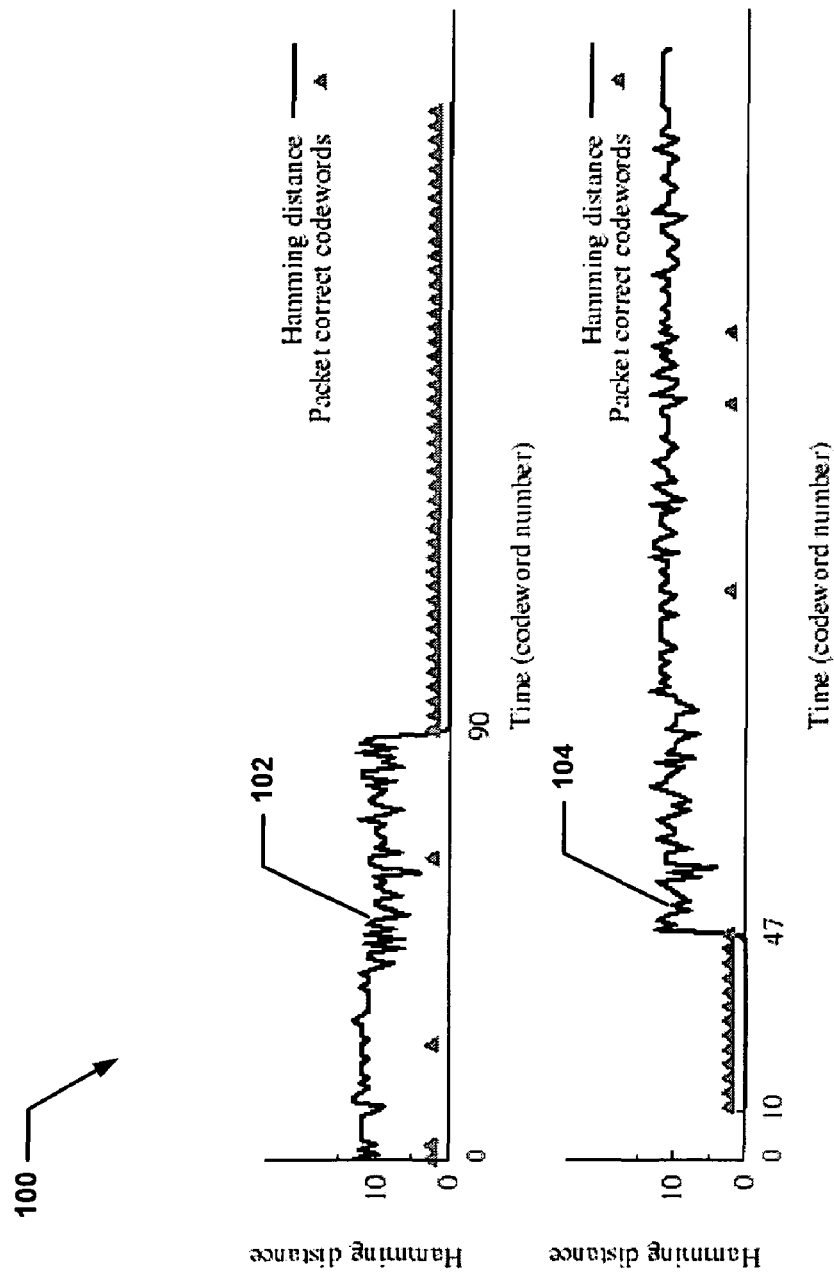
FIG. 4 is a graph showing partial packet reception at two different codeword synchronization offsets.

FIG. 4 shows a receiver's view of a packet sent from one sender, at two different codeword synchronization offsets. The packet contains a known bit pattern, against which each received codeword was tested for correctness. The result of each test is indicated by the presence or absence of a triangle in the figure. The upper plot 102 in FIG. 4 shows the packet arriving at the receiver at time 0, and achieving synchronization at time 10 (lower plot 104). When the PHY synchronizes on the packet, symbol timing recovery succeeds and the receiver decodes approximately 40 codewords correctly (including the preamble) before losing symbol or codeword synchronization. It can be observed that Hamming distance remains at 0 for the duration of the correct codeword decisions, and rises at time 47 when the burst of errors occurs. The PHY passes these Hamming distance hints up to the ARQ layer along with all the codewords in the packet.

Later, at time 90 at the other synchronization offset (upper plot 102), the receiver successfully synchronizes on and decodes a run of codewords extending to the end of the first packet. Since this packet data is at a different synchronization offset to the preamble, it relies on its postamble in order to frame-synchronize and pass up the partial packet reception and associated SoftPHY hints.

Figure 5:
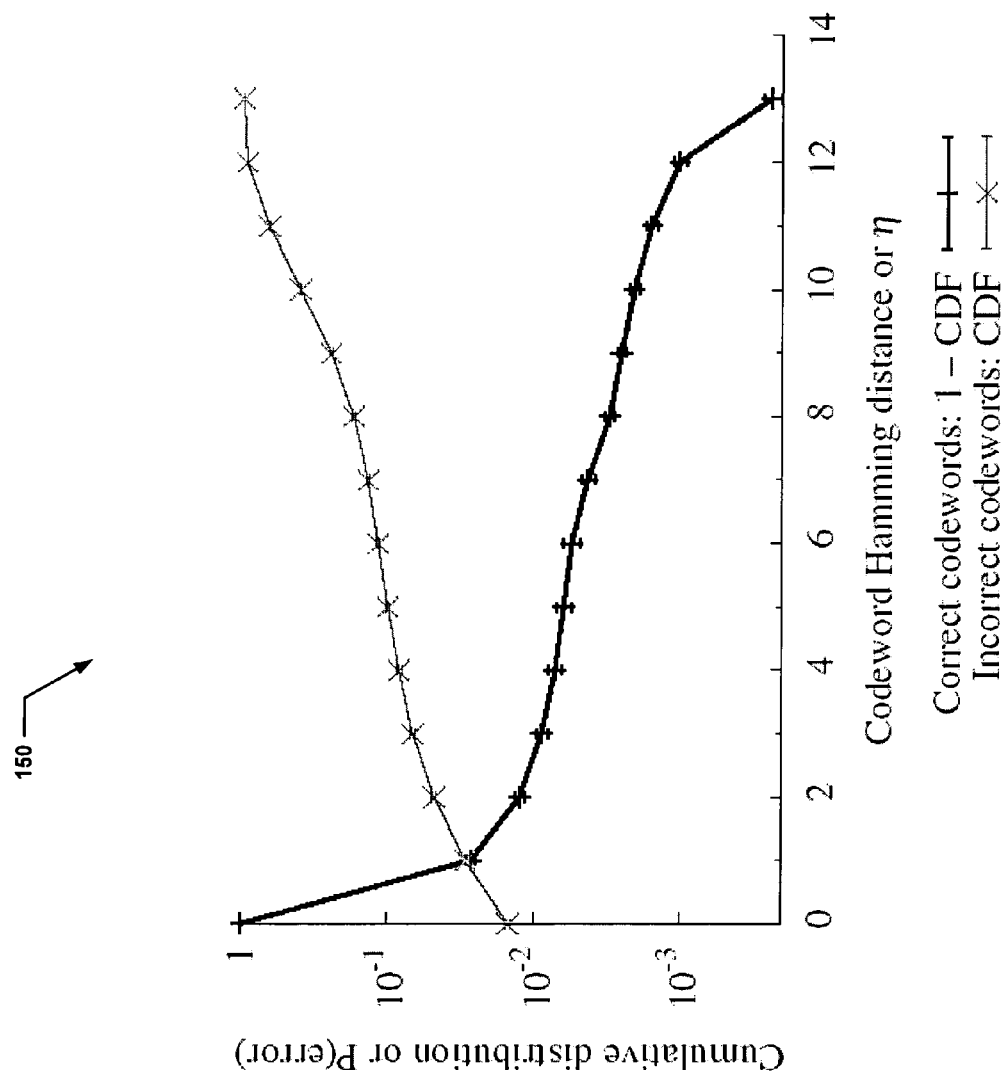
FIG. 5 is a graph showing distributions of Hamming distances for codewords in a received packet.

Another experiment was performed in a 31-node Zigbee/software radio testbed. All but four of the nodes send packets containing a known test pattern, at a constant rate. There are four receivers, each able to hear and decode some subset of the senders. FIG. 5 shows the distribution of Hamming distance across each received codeword, separated by whether the codeword was correctly or incorrectly received (known from the test pattern). Conditioned on a correct decoding, only about one in 100 codewords have a Hamming distance of two or more. Conversely, fewer than one in 10 incorrect codewords have a distance of two or less.

This result shows that the higher layer can interpret this SoftPHY hint with a threshold rule. The threshold is denoted by $\eta$, so that the higher layer labels groups of bits with $d \leq \eta$ "good" and groups of bits with $d > \eta$ "bad." Under the threshold rule then, the two curves in FIG. 5 also show the probability of misclassification for correct and incorrect symbols, respectively.

Figure 6:
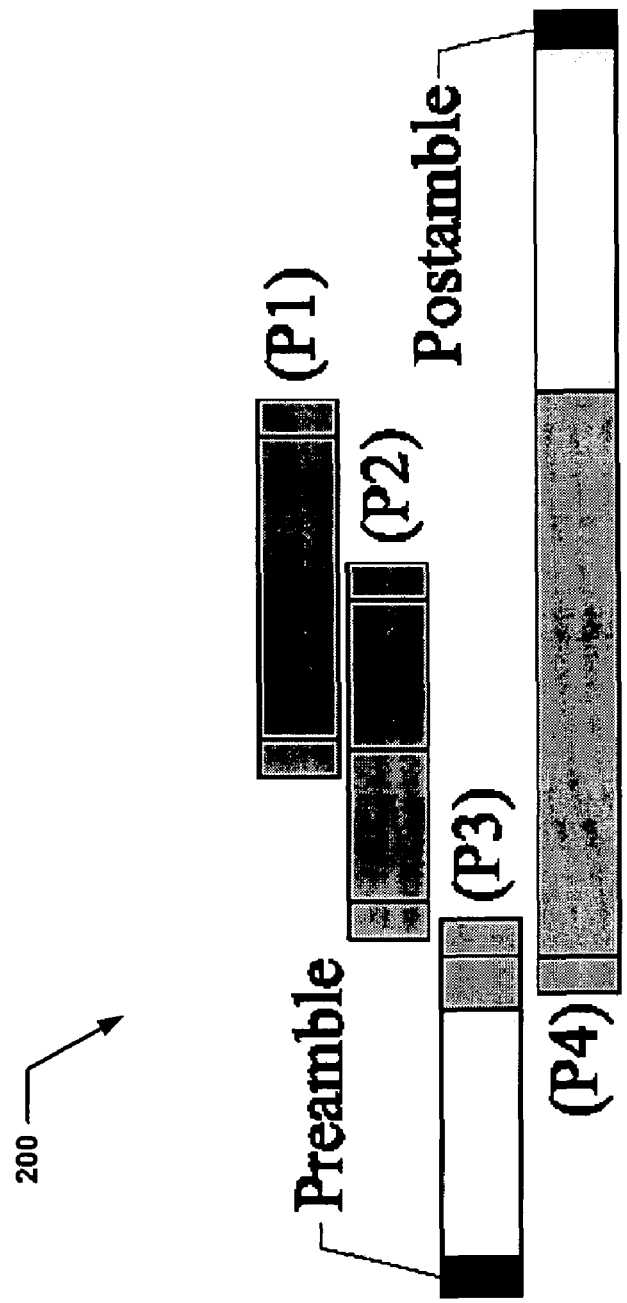
FIG. 6 is a block diagram showing a four-packet collision.

When many errors occur in the preamble due to collisions or noise, current radio receivers will not be able to synchronize with the incoming transmission and decode any bits. In that case, some benefits of SoftPHY may go unrealized. A technique to mitigate the effects of preamble loss, for example, in the multi-packet collision 200 shown in FIG. 6 is required. In this example, a receiver would not be able to decode any part of packet P4, since its preamble was corrupted, while packet P3 would be received and discarded due to a bad checksum. SoftPHY may help with P3, but it is desirable to decode P4 as well.

One approach to synchronizing on packets without an intelligible preamble is to add a postamble to the end of each packet on which a receiver can also synchronize. The postamble has a well-known sequence attached to it that uniquely identifies it as the postamble, and differentiates it from a preamble ("EFD" in FIG. 3). In addition, a trailer is added just before the postamble at the end of the packet, also shown in FIG. 3. The trailer contains the packet length, source address, and destination address. Just as with header data, the receiver uses the SoftPHY interface to check the correctness of the trailer.

To recover the payload after hearing just a postamble, the receiver maintains a circular buffer of samples of previously-received symbols even when it has not heard a preamble. In a particular implementation, as many sampled symbols are kept as there are in one maximally-sized packet. When the receiver detects a preamble, the behavior is the same as in the status quo. If not, then if the receiver detects a postamble, it takes the following steps:
 1. "Roll back" as many symbols as are in the packet trailer.
 2. Decode and parse the trailer to find the start of the entire packet, and the sender and receiver identities.
 3. "Roll back" in time as many symbols as are in the entire packet, to decode as much of the packet as possible.

One challenge associated with postamble decoding is addressing how a receiver can keep a modest number of samples of the incoming packet in a circular buffer while still allowing the various receiver subsystems to perform their intended functions. These functions include carrier recovery, symbol timing recovery, and equalization.

Most receivers need to perform symbol timing recovery to determine when (i.e., with which frequency and phase) to sample the incoming signal such that the probability of detection is maximized. In the present system, the decision-directed timing recovery algorithm is used. Next, the demodulator may need to perform carrier recovery to estimate the incoming carrier's time-varying frequency and phase. A number of techniques for countering inter-symbol interference rely on estimating the channel impulse response (equalization). Typically the preamble includes a known training sequence to enable the equalizer to quickly estimate the channel's response during synchronization. The same training sequence is therefore included in the postamble (see FIG. 3) and the samples of the signal in the body of the packet are post-processed afterwards, using standard signal processing techniques.

SoftPHY and postamble detection together allow higher layers to discover which received codewords are likely to be correct and which are not. The problem of how the receiver can most efficiently communicate this information back to the sender to improve the performance of link-level retransmissions will now be discussed. One way to provide feedback is for each receiver to send back the bit ranges of each part of the packet believed to be incorrect. Unfortunately, doing that may consume a large number of bits, because encoding the start of a range and its length can take up to on the order of log S bits for a packet of size S. Hence, a need to develop a more efficient feedback scheme exists.

Figure 7:
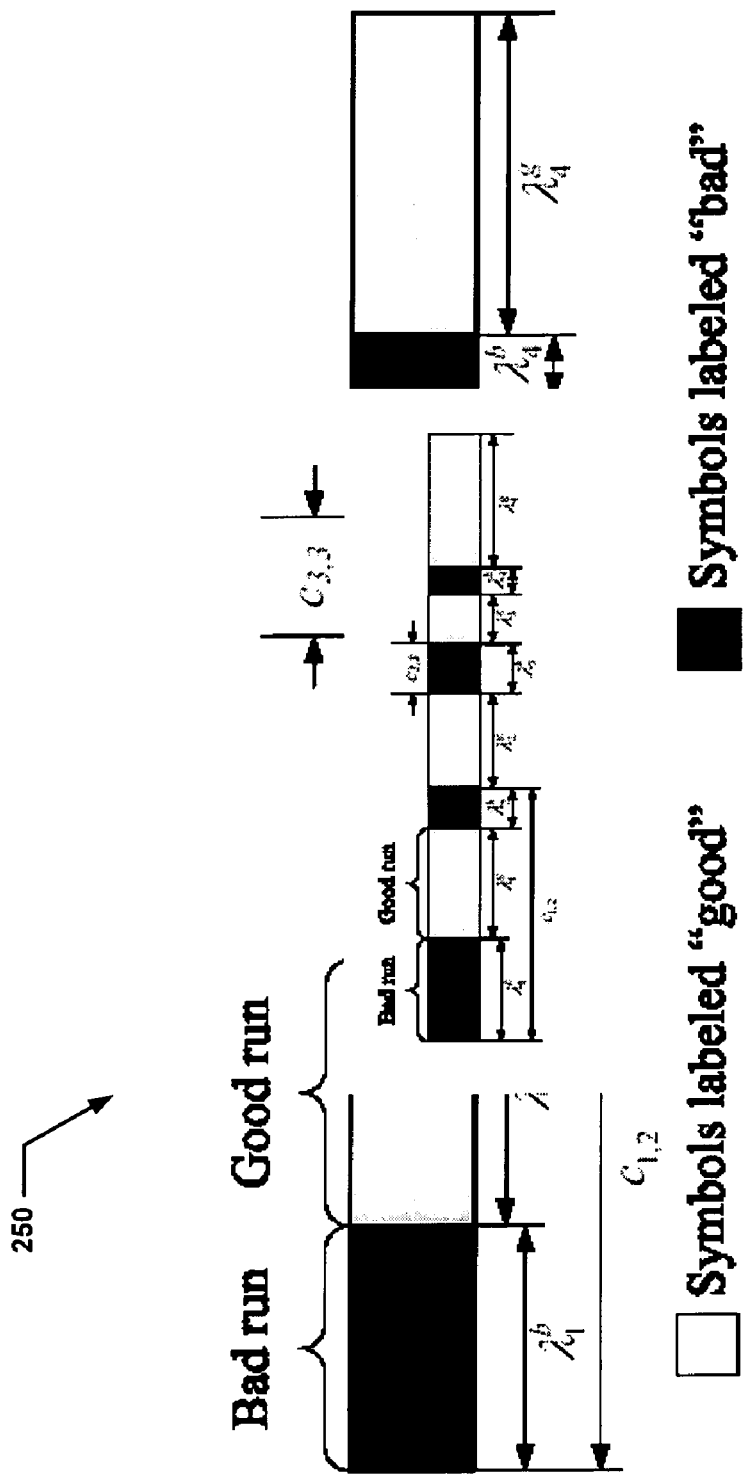
FIG. 7 is a diagram showing run-length computations for a received packet.

After the receiver has decoded a packet, it has a list of received symbols $S_i$, $1 \leq i \leq N$, and a list of associated PHY layer hints $\phi_i$ where $\phi_i$ is the confidence the PHY has in symbol $S_i$. Then the receiver uses the threshold test on each confidence $\phi_i$, and labels each symbol "good" or "bad.". Next, the receiver computes alternating run lengths $\lambda_j^g, \lambda_j^b$, $1 \leq j \leq L$, of good and bad symbols, respectively, to form the run-length representation of the packet 250 as shown in FIG. 7. This representation has the form:

$$\lambda_1^b, \lambda_1^g, \lambda_2^b, \lambda_2^g, \ldots \lambda_L^b, \lambda_L^g \quad (2)$$

Here, $\lambda_j^g$ is the count of symbols in the jth run of symbols all rated "good" by SoftPHY, shown with light shading in FIG. 7. Similarly, $\lambda_k^b$ is the size of the kth run of symbols rated "bad" by SoftPHY, shown with dark shading in FIG. 7.

The receiver forms a list of chunks $c_{i,j}$: groups of runs that it will ask the sender to retransmit. Chunk $c_{i,j}$ contains all the bad and good runs in between and including bad run i and bad run j, so each chunk starts and ends with bad runs. For example, chunks $c_{1,2}$ and $c_{3,3}$ appear in FIG. 7. Note that chunk $c_{i,j}$ does not include $\lambda_j^g$, the last run of good symbols in the chunk:

$$c_{i,j} = \lambda_i^b, \lambda_i^g, \lambda_{i+1}^b, \lambda_{i+1}^g, \ldots \lambda_j^b \quad (3)$$

Once the receiver has made the choice of which chunks to request from the sender, it sends a feedback packet communicating this information. Each chunk can be assigned a cost function, and the problem of which chunks to request exhibits the "optimal substructure" property in that the cost for an entire chunk is easily derived from the cost of two suitably divided portions. When the sender responds to the receiver's feedback packet, it also sends the checksums of the good chunks so that the receiver can verify that they are correct.

If $\lambda_k^g$, $1 \leq k \leq j$ are all small and j−i is large, it is better to request the entire chunk $c_{i,j}$ be retransmitted, because the additional bits it would take for the receiver to describe each of the j−i individual chunks would far exceed that needed to retransmit the good symbols associated with chunk $c_{i,j}$. If, on the other hand, some of the $\lambda_k^g$, $1 \leq k \leq j$ are large, and/or j−i is small, it would be beneficial to ask for the individual chunks $c_{k,k}$ for each $k \in [i,j]$ for the converse reason.

The cost of a chunk is defined as follows (i≠j):

$$C(c_{i,j}) = \log S + \log \lambda_i^b + \min(\lambda_i^g, \lambda_c) \quad (4)$$

$$C(c_{i,j}) = \min\left\{ 2\log S + \sum_{l=1}^{j-1} \lambda_l^g, \min_{i \leq k \leq j-1}\left\{ C(c_{i,k}) + C(c_{k+1,j}) \right\} \right\} \quad (5)$$

For the receiver to describe the length and offset of the ith bad run to the sender, it takes approximately $\log S + \log \lambda_i^b$ bits, where S is the packet length. The receiver also sends the ith good run or a checksum of it to the sender, so that the sender can verify that it received the good run correctly. This takes $\min(\lambda_i^g, \lambda_C)$ bits, where $\lambda_C$ is the length of the checksum. These two terms form the base case cost of a chunk in Equation 4.

The receiver then runs the recursive steps of the DP algorithm on the run-length representation of the packet. Equation 5 describes this computation. The outer min chooses between leaving chunk $c_{i,j}$ intact (thus resending all good runs within the chunk), or splitting the chunk into two smaller chunks and thus diving deeper into the recursive computation. The innermost min operator chooses how to make the split, if one is needed.

The optimal chunking is computed bottom-up using a table to memoize the costs of each possible chunking Note that because the chunking algorithm operates on chunks, the table has as many entries as there are chunks in the packet, L. To analyze the computational complexity of this algorithm, it is noted that it can be implemented in a bottom-up fashion using a table to memoize the costs of each possible chunking. This results in an $O(L^3)$ implementation.

The receiver-side dynamic programming algorithm described above chooses chunks such that each chunk "covers" all the bad runs in the packet, and may cover some good runs, if they are short enough. The complete PP-ARQ protocol between sender and receiver is described below.

1. The sender transmits the full packet with checksum.
2. The receiver decodes the packet (possibly partially), and computes the best feedback.
3. The receiver encodes the feedback set in its reverse-link acknowledgement packet (which may be empty, if the receiver can verify the forward link packet's checksum).
4. The sender retransmits only (a) the contents of the runs the receiver requests, and (b) checksums of the remaining runs.

This process continues, with multiple forward-link data packets and reverse-link feedback packets being concatenated together in each transmission, to save per-packet overhead.

In another embodiment the method also includes the process of applying a rateless erasure code to the data to be transmitted, such as an LT code or Raptor code. Consider a single communications link between a sender S and a receiver R. The sender first codes packets of length k bits with the rateless code, and transmits the first $m \geq k$ bits to the receiver, where $n \geq m \geq k$. The sender may choose m to optimize performance, accounting for a background error rate.

The receiver then attempts to decode the packet, outputting SoftPHY hints to determine the amount of additional coded data necessary for the sender to transmit in order to recover the packet.

The receiver communicates this amount to the sender in a feedback packet, and then the sender transmits the requested amount of additional coded data to the receiver. The receiver combines the additional coded bits with the coded bits that it previously received using maximal ratio combining, and attempts to decode the k bits of source information. The process repeats until the k bits of source information pass a checksum calculation at the receiver.

The method also includes the process of applying a fixed-rate erasure code such as Reed-Solomon to the data to be transmitted. Again consider a single communications link between a sender S and a receiver R. The sender first codes packets of length k bits with the erasure code, to obtain coded packets of length n bits. Then the sender transmits the first m bits to the receiver, where $n \geq m \geq k$. The sender may choose m to optimize performance, accounting for a background error rate.

The receiver then attempts to decode the packet, outputting SoftPHY hints to determine the amount of additional coded data necessary for the sender to transmit in order to recover the packet.

The receiver communicates this amount to the sender in a feedback packet, and then the sender transmits the requested amount of additional coded data to the receiver. The receiver combines the additional coded bits with the coded bits that it previously received using maximal ratio combining, and attempts to decode the k bits of source information. The process repeats until the k bits of source information pass a checksum calculation at the receiver, or until n bits have been transmitted, whichever comes first.

PPR improves the performance of mesh network protocols such as opportunistic routing and network coding. Using PPR, nodes need only forward or combine the bits likely to be correct in a packet that does not pass checksum, thus improving network capacity. Rather than use PP-ARQ, the integrated MAC/link layer that implements ExOR or network coding would directly work with SoftPHY's output. Alternatively, PP-ARQ could operate in the "background recovering erroneous data, while the routing protocol sends the correct bits forward.

PPR also has the potential to improve the performance of multi-radio diversity (MRD) schemes in which multiple access points listen to a transmission and combine the data to recover errors before forwarding the result, saving on retransmissions. Others have developed a scheme in which multiple nodes (e.g., access points) exchange soft decision estimates of each data symbol and collaboratively use that information to improve decoding performance. For this application, PPR's SoftPHY hints would provide a way to design a protocol that does not rely on the specifics of the PHY, unlike this previous work. Thus, with PPR, a simpler design is obtained and PHY-independence of the block-based combining, while also achieving the performance gains of using PHY information.

A flow diagram of the presently disclosed methods is depicted in FIGS. 8-11. The rectangular elements are herein denoted "processing blocks" and represent computer software instructions or groups of instructions. Alternatively, the processing blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required in accordance with the present invention. It should be noted that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention. Thus, unless otherwise stated the steps described below are unordered meaning that, when possible, the steps can be performed in any convenient or desirable order.

Figure 8:
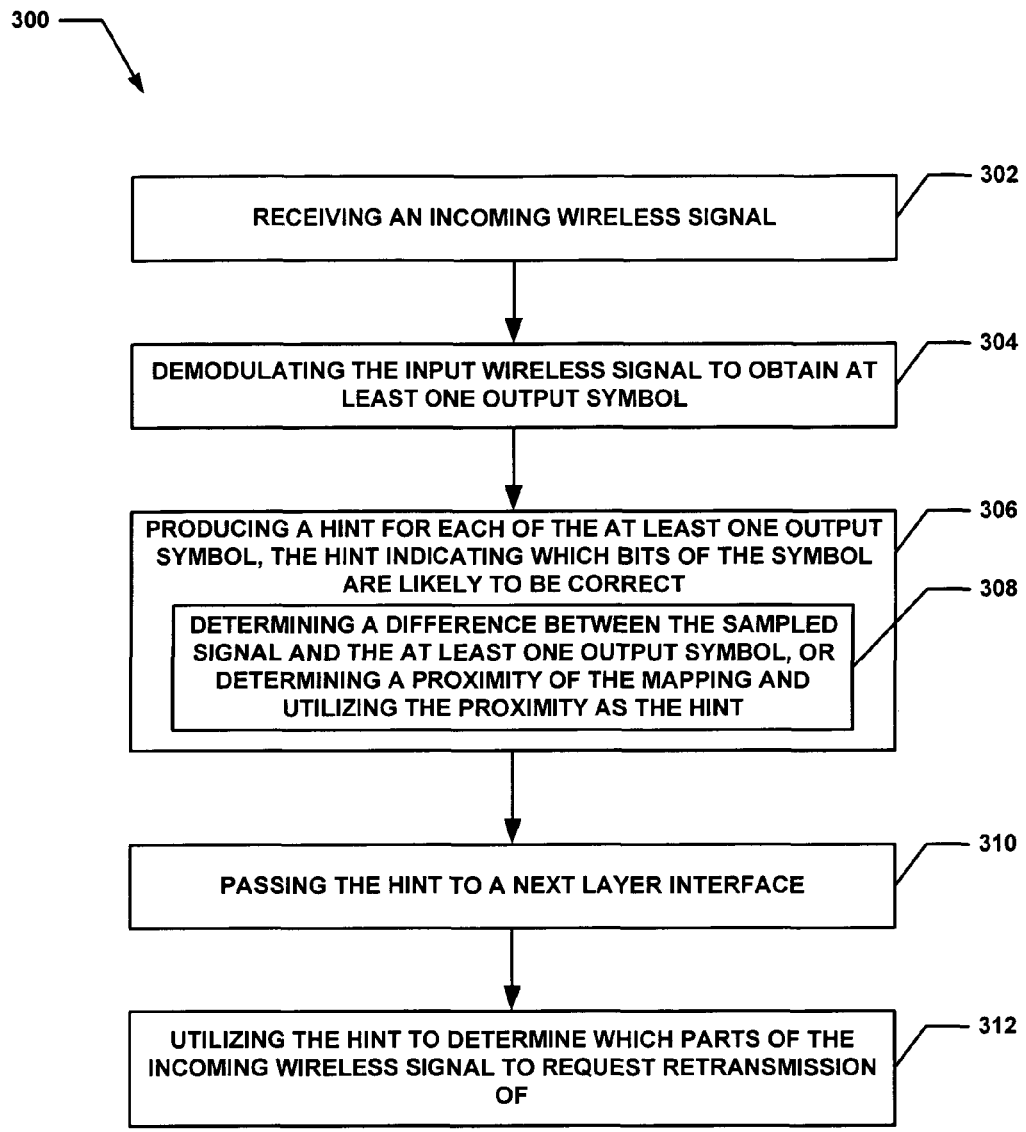
FIG. 8 is a flow diagram of a particular method of providing partial packet recovery in accordance with embodiments of the invention.

Referring now to FIG. 8, a flow diagram of a particular method 300 of providing partial packet recovery in accordance with embodiments of the invention is shown. Method 300 begins with processing block 302, which discloses receiving an incoming wireless signal.

Processing block 302 states demodulating the input wireless signal to obtain at least one output symbol. The demodulating method is described in detail below with respect to FIG. 9.

Processing block 306 recites producing a hint for each of the at least one output symbol, the hint indicating which bits of the symbol are likely to be correct. As shown in processing block 308, producing a hint may include determining a difference between the sampled signal and the at least one output symbol, or determining a proximity of the mapping and utilizing the proximity as the hint.

Processing block 310 recites passing the hint to a next layer interface and processing block 312 discloses utilizing the hint to determine which parts of the incoming wireless signal to request retransmission of.

Figure 9:
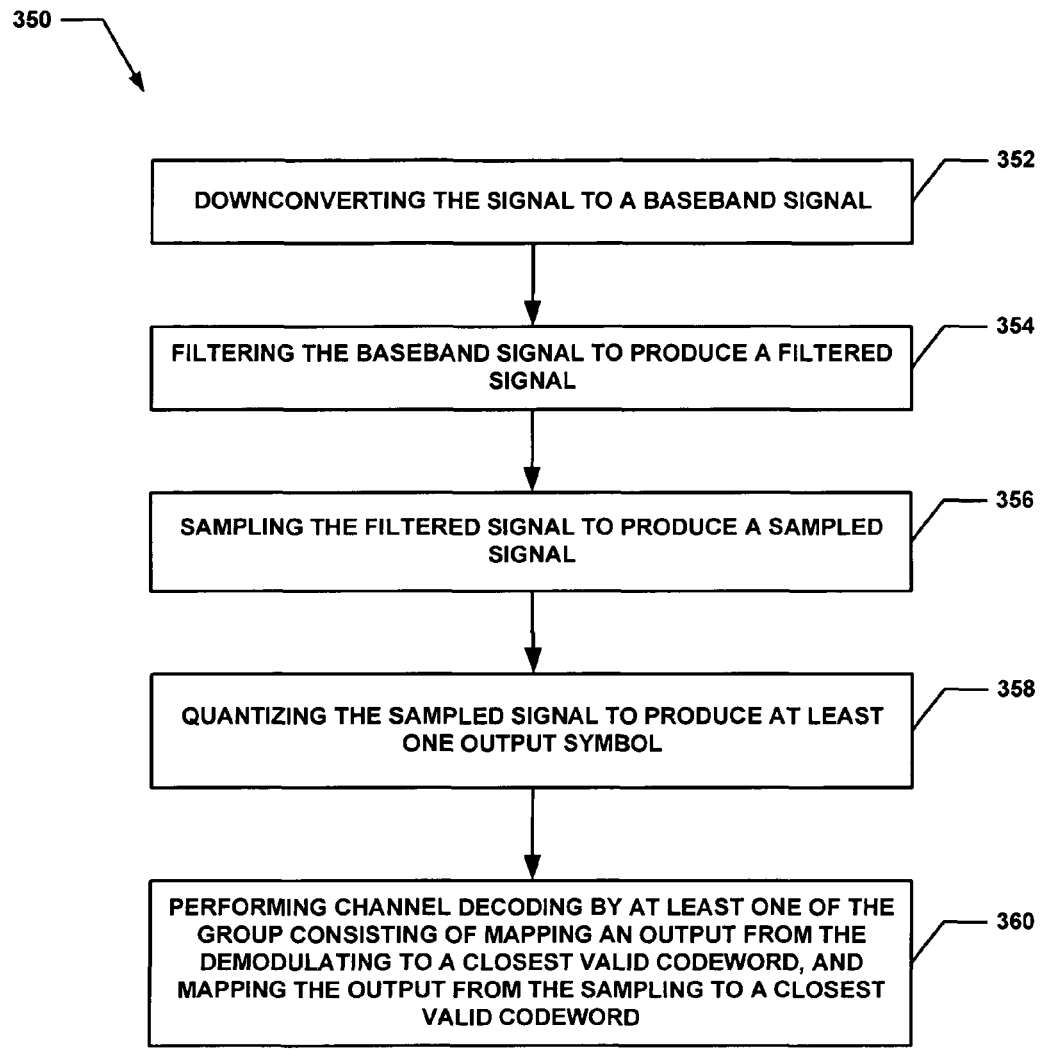
FIG. 9 is a flow diagram of a particular method of demodulating a received signal in accordance with embodiments of the invention.

FIG. 9 is a flow diagram of a particular method 350 of demodulating a received signal in accordance with embodiments of the invention. Method 350 begins with processing block 352, which discloses downconverting the signal to a baseband signal. As shown in processing block 354 the baseband signal is then filtered to produce a filtered signal.

Processing continues with processing block 356, which states sampling the filtered signal to produce a sampled signal. Processing block 358 recites quantizing the sampled signal to produce at least one output symbol.

Processing block 360 discloses performing channel decoding by at least one of the group consisting of mapping an output from the demodulating to a closest valid codeword, and mapping the output from the sampling to a closest valid codeword.

Figure 10:
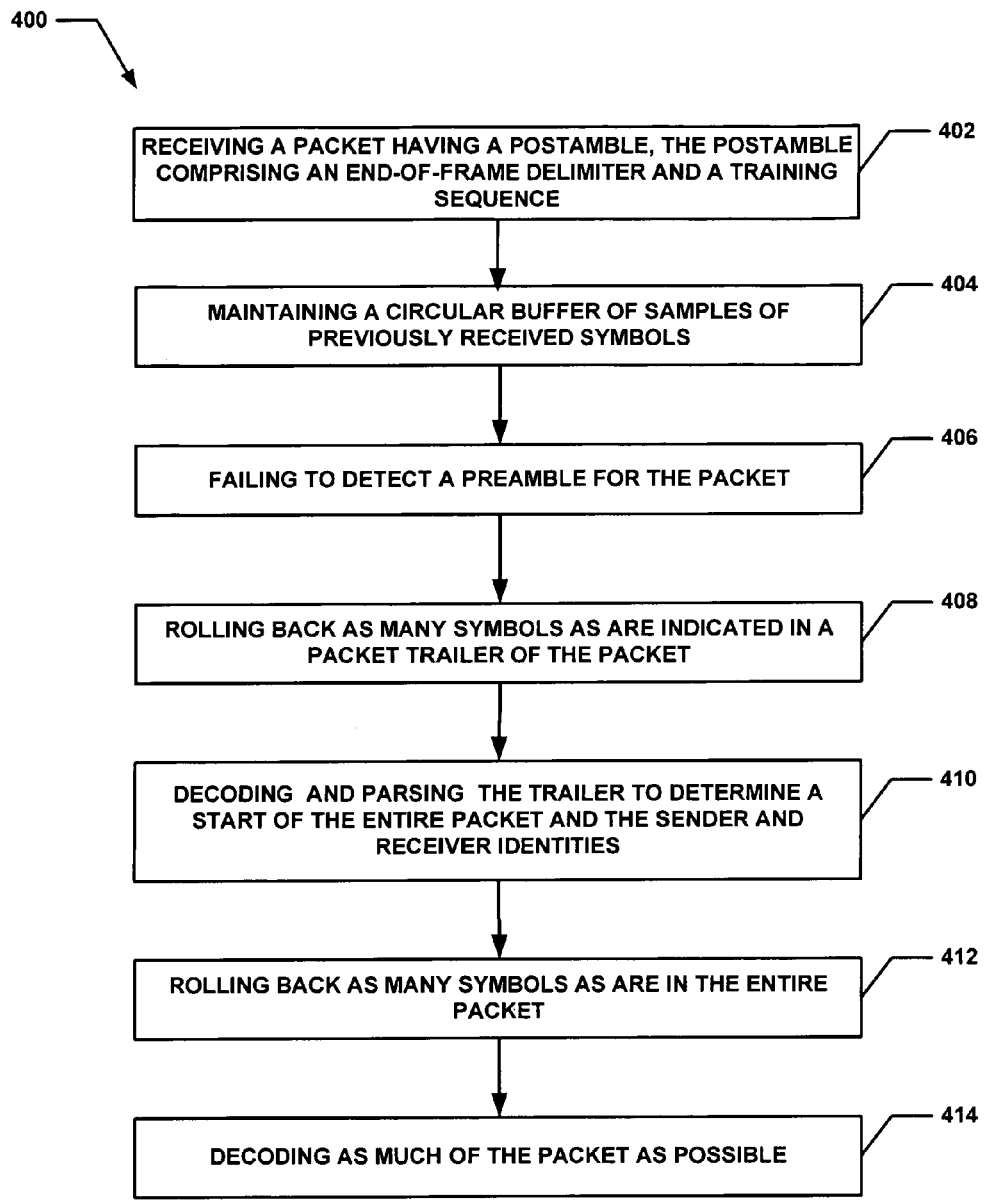
FIG. 10 is a flow diagram of a particular method of performing postamble packet decoding in accordance with embodiments of the invention.

FIG. 10 is a flow diagram of a particular method 400 of performing postamble packet decoding. Method 400 begins with processing block 402 which discloses receiving a packet having a postamble, the postamble comprising an end-of-frame delimiter and a training sequence.

Processing block 404 states maintaining a circular buffer of samples of previously received symbols. Processing block 406 recites failing to detect a preamble for the packet.

Processing continues with processing block 408 which discloses rolling back as many symbols as are indicated in a packet trailer of the packet, and as shown in processing block 410, decoding and parsing the trailer to determine a start of the entire packet and the sender and receiver identities. Processing further includes, as recited in processing block 412 and 414 respectively, rolling back as many symbols as are in the entire packet, and decoding as much of the packet as possible.

Figure 11:
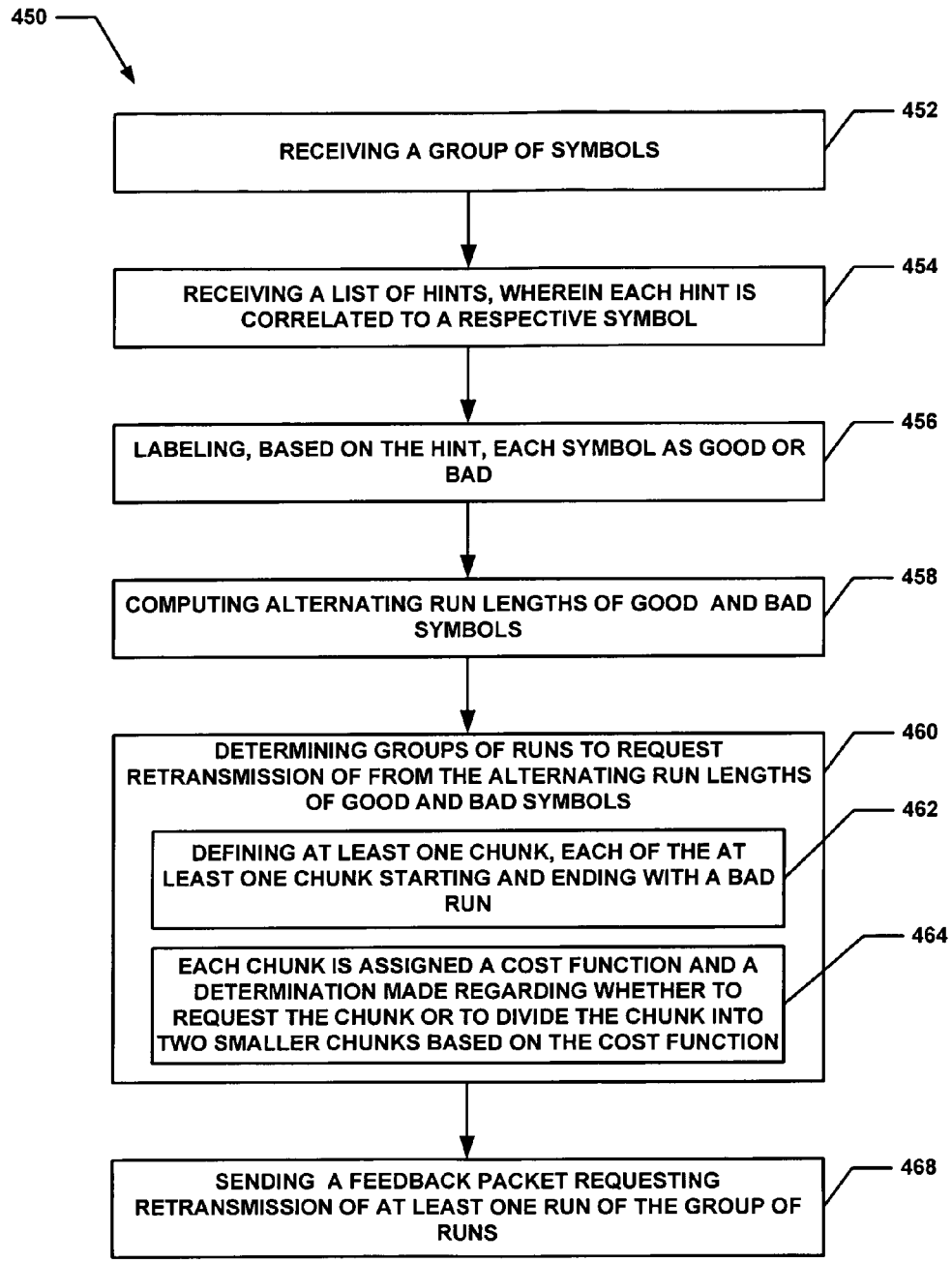
FIG. 11 is a flow diagram of a particular method of utilizing received symbols and hints to determine and request retransmission of a partial packet in accordance with embodiments of the invention.

FIG. 11 is a flow diagram of a particular method 450 of utilizing received symbols and hints to determine and request retransmission of a partial packet. Method 450 begins with processing block 452, which discloses receiving a group of symbols, followed by processing block 454, which states receiving a list of hints, wherein each hint is correlated to a respective symbol.

Processing block 456 recites labeling, based on the hint, each symbol as good or bad. Processing block 458 discloses computing alternating run lengths of good and bad symbols.

Processing continues with processing block 460, which discloses determining groups of runs to request retransmission of from the alternating run lengths of good and bad symbols. Processing block 462 states the determining groups of runs comprises defining at least one chunk, each of the at least one chunk starting and ending with a bad run. Processing block 464 recites each chunk is assigned a cost function and a determination made regarding whether to request the chunk or to divide the chunk into two smaller chunks based on the cost function.

Processing block 468 discloses sending a feedback packet requesting retransmission of at least one run of the group of runs.

Having described preferred embodiments of the invention it will now become apparent to those of ordinary skill in the art that other embodiments incorporating these concepts may be used. Additionally, the software included as part of the invention may be embodied in a computer program product that includes a computer useable medium. For example, such a computer usable medium can include a readable memory device, such as a hard drive device, a CD-ROM, a DVD-ROM, or a computer diskette, having computer readable program code segments stored thereon. The computer readable medium can also include a communications link, either optical, wired, or wireless, having program code segments carried thereon as digital or analog signals. Accordingly, it is submitted that that the invention should not be limited to the described embodiments but rather should be limited only by the spirit and scope of the appended claims.

What is claimed is:

1. A method comprising:
   receiving an incoming wireless signal;
   demodulating said input wireless signal to obtain at least one output symbol;
   producing a hint for each of said at least one output symbol, said hint comprising a distance in signal space between a constellation point of the input wireless signal and a constellation point of the output symbol;
   passing said hint to a next layer interface; and
   utilizing said hint to determine parts of said incoming wireless signal to request retransmission.

2. The method of claim 1 wherein said demodulating comprises:
   downconverting said signal to a baseband signal;
   filtering said baseband signal to produce a filtered signal;
   sampling said filtered signal to produce a sampled signal; and
   quantizing said sampled signal to produce at least one output symbol.

3. The method of claim 1 further comprising performing channel decoding by at least one of the group consisting of mapping an output from said demodulating to a closest valid codeword, and mapping the output from said sampling to a closest valid codeword.

4. The method of claim 3 wherein said producing a hint comprises at least one of the group consisting of determining a difference between said sampled signal and said at least one output symbol, and determining a proximity of said mapping and utilizing said proximity as said hint.

5. The method of claim 1 further comprising performing postamble packet decoding, said postamble packet decoding comprising:
   receiving a packet having a postamble, said postamble comprising an end-of-frame delimiter and a training sequence;
   maintaining a circular buffer of samples of previously received symbols;
   failing to detect a preamble for said packet;
   rolling back as many symbols as are indicated in a packet trailer of said packet;
   decoding and parsing said trailer to determine a start of the entire packet and the sender and receiver identities;
   rolling back as many symbols as are in the entire packet; and
   decoding at least a portion of said packet.

6. A computer readable medium for storing a computer readable code, when executed by a computer, causes the computer to execute partial packet recovery in wireless networks, the medium comprising:
   instructions for receiving an incoming wireless signal;
   instructions for demodulating said input wireless signal to obtain at least one output symbol;
   instructions for producing a hint for each of said at least one output symbol, said hint comprising a distance in signal space between a constellation point of the input wireless signal and a constellation point of the output symbol;
   instructions for passing said hint to a next layer interface; and
   instructions for utilizing said hint to determine parts of said incoming wireless signal to request retransmission.

7. The computer readable medium of claim 6 wherein said instructions for demodulating comprises:
   instructions for downconverting said signal to a baseband signal;
   instructions for filtering said baseband signal to produce a filtered signal;
   instructions for sampling said filtered signal to produce a sampled signal; and
   instructions for quantizing said sampled signal to produce at least one output symbol.

8. The computer readable medium of claim 6 further comprising instructions for performing channel decoding by at least one of the group consisting of instructions for mapping an output from said demodulating to a closest valid codeword, and instructions for mapping the output from said sampling to a closest valid codeword.

9. The computer readable medium of claim 8 wherein said instructions for producing a hint comprises at least one of the group consisting of instructions for determining a difference between said sampled signal and said at least one output symbol, and instructions for determining a proximity of said mapping and utilizing said proximity as said hint.

10. The computer readable medium of claim 6 further comprising instructions for performing postamble packet decoding, said instructions for postamble packet decoding comprising:
    instructions for receiving a packet having a postamble, said postamble comprising an end-of-frame delimiter and a training sequence;
    instructions for maintaining a circular buffer of samples of previously received symbols;
    instructions for failing to detect a preamble for said packet;
    instructions for rolling back as many symbols as are indicated in a packet trailer of said packet;
    instructions for decoding and parsing said trailer to determine a start of the entire packet and the sender and receiver identities;
    instructions for rolling back as many symbols as are in the entire packet; and
    instructions for decoding at least a portion of said packet.

11. An apparatus comprising:
    a demodulator including a downconverter receiving an incoming wireless signed; and
    the demodulator demodulating said input wireless signal to obtain at least one output symbol, the demodulator producing a hint for each of said at least one output symbol, said hint comprising a distance in signal space between a constellation point of the input wireless signal and a constellation point of the output symbol, said demodulator passing said hint to a next layer interface wherein said hint is utilized to determine parts of said incoming wireless signal to request retransmission.

12. The apparatus of claim 11 wherein said demodulator comprises;
    a downconverter for downconverting said signal to a baseband signal;
    a matched filter in communication with said downconverter, said matched filter filtering said baseband signal to produce a filtered signal;
    a sampler in communication with said matched filter for sampling said filtered signal to produce a sampled signal; and
    a slicer in communication with said sampler, said slicer quantizing said sampled signal to produce at least one output symbol.

13. The apparatus of claim 11 wherein the apparatus performs the operations of channel decoding by at least one of the group consisting of mapping an output from said demodulating to a closest valid codeword, and mapping the output from said sampling to a closest valid codeword.

14. The apparatus of claim 11 wherein said hint comprises at least one of the group consisting of a difference between said sampled signal and said at least one output 24, and a proximity of said mapping and utilizing said proximity as said hint.

15. The apparatus of claim 11 wherein the apparatus performs the operations of performing postamble packet decoding, said postamble packet decoding comprising:

receiving a packet having a postamble, said postamble comprising an end-of-frame delimiter and a training sequence;

maintaining a circular buffer of samples of previously received symbols;

failing to detect a preamble for said packet;

rolling back as many symbols as are indicated in a packet trailer of said packet;

decoding and parsing said trailer to determine a start of the entire packet and the sender and receiver identities;

rolling back as many symbols as are in the entire packet; and decoding at least a portion of said packet.

\* \* \* \* \*